United States Patent
Yamamoto

(10) Patent No.: US 7,183,007 B2
(45) Date of Patent: Feb. 27, 2007

(54) DICING ADHESIVE SHEET AND DICING METHOD

(75) Inventor: Syouji Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 111 days.

(21) Appl. No.: 10/486,165

(22) PCT Filed: Aug. 2, 2002

(86) PCT No.: PCT/JP02/07914

§ 371 (c)(1),
(2), (4) Date: Jun. 21, 2004

(87) PCT Pub. No.: WO03/016419

PCT Pub. Date: Feb. 27, 2003

(65) Prior Publication Data

US 2005/0000638 A1    Jan. 6, 2005

(30) Foreign Application Priority Data

Aug. 10, 2001 (JP) ............................ 2001-243684

(51) Int. Cl.
  *C09J 7/00* (2006.01)
(52) U.S. Cl. ............... 428/500; 428/41.8; 428/64.1; 428/344; 156/248; 156/257; 156/268; 83/875; 83/880
(58) Field of Classification Search ........... 428/41.8, 428/345, 354, 64.1, 500; 156/268, 257, 344; 156/248; 83/880
See application file for complete search history.

(56) References Cited

FOREIGN PATENT DOCUMENTS

| EP | 0 976 802 A1 | 2/2000 |
|---|---|---|
| EP | 0 981 156 A2 | 2/2000 |
| EP | 1 043 373 A2 | 10/2000 |
| EP | 1 347 025 A1 | 9/2003 |
| JP | 61-243878 | 10/1986 |
| JP | 10-150007 | 6/1998 |
| JP | 2000-104026 | 4/2000 |
| JP | 2000-239620 | 9/2000 |
| JP | 2000-290609 | 10/2000 |
| JP | 2002-155249 | 5/2002 |
| JP | 2002-203822 | 7/2002 |

OTHER PUBLICATIONS

Document for submitting Publication dated Feb. 28, 2006 to Japanese Patent Office.

*Primary Examiner*—Linda Gray
(74) *Attorney, Agent, or Firm*—Knobbe Martens Olson & Bear LLP

(57) ABSTRACT

A dicing adhesive sheet having a base film and an adhesive layer formed on the base film is characterized in that the thickness of the adhesive layer ranges from 1 to 10 μm and the adhesive layer has an sticking temperature such that the adhesion measured when 180° peeling at 23° C. of the dicing sheet is conducted (the peeling rate is 300 mm/min) after it is applied to a silicon mirror wafer is 10 N/25 mm or more. In a dicing method using such a dicing adhesive sheet, the production yield of a diced body such as a semiconductor wafer is high, and chipping the dicing is prevented.

4 Claims, 1 Drawing Sheet

DICING ADHESIVE SHEET AND DICING METHOD

This application is the U.S. National Phase under 35 U.S.C. §371 of International Application PCT/JP02/07914, filed on Aug. 2, 2002, which claims priority of Japanese Patent Application Nos. 2001-243684, filed on Aug. 10, 2001. The International Application was published under PCT Article 21(2) in a language other than English.

TECHNICAL FIELD

The present invention relates to a dicing adhesive sheet and to a dicing method using the dicing adhesive sheet. In particular, the dicing adhesive sheet of this invention is useful as a semiconductor wafer-dicing adhesive sheet, which is used to fix a deiced body such as a semiconductor wafer in the process of cutting and dividing (dicing) the semiconductor wafer or the like into device pieces. For example, the dicing adhesive sheet of this invention sheet can be used as a dicing adhesive sheet for in silicon semiconductor, a dicing adhesive sheet for compound semiconductor wafer, a dicing adhesive sheet for semiconductor package, a dicing adhesive sheet for glass, or the like.

BACKGROUND ART

Conventionally, a semiconductor wafer made of a material such as silicon, gallium, arsenic or the like is produced with its large diameter scale and then cut and divided (diced) into device pieces, which are then transferred to a mounting step. In such a process, the semiconductor wafer, which is stuck to an adhesive sheet and held on it, is subjected to a dicing step, a cleaning step, an expanding step, a picking up step, and a mounting step, respectively. The dicing adhesive sheet generally comprises a plastic film base and an about 10 to 30 μm thick adhesive layer that is formed on the base and made of an acrylic adhesive or the like. For example, such an adhesive sheet that exhibits a peeling adhesion of about 1.5 to 6 N/25 mm to a silicon mirror wafer (sticking at 23° C. and peeling at 23° C.) is generally employed.

In the dicing process, the wafer is cut with a rotating and moving circular blade. A dominant cutting technique for such a process has been the so-called full-cut technique in which cutting is also performed on the inner part of the base of the dicing adhesive sheet that holds the semiconductor wafer.

When the semiconductor wafer is cut by the full-cut method using a conventional dicing adhesive sheet that has an about 10 to 30 μm thick adhesive layer and exhibits a peeling adhesion of about 1.5 to 6 N/25 mm, a crack called chipping can occur on the back side face of the semiconductor device (wafer). In recent years, as IC cards have become widely used, thin semiconductor devices have been developed and used. Chipping of such semiconductor devices can cause to a serious reduction in the strength of the semiconductor devices and cause to a significant reduction in reliability.

It is assumed that the mechanism of chipping in the dicing process should generally be as shown below. Referring to FIG. 2, in the full-cut process, a circular blade 3 cuts into a base film 11 of a adhesive sheet 1, so that an adhesive layer 12 or the base film 11 is pressed by the circular blade 3 to be deformed in the direction of the rotation and the forward direction. In such a process as shown in FIG. 2, separating occurs in a minute area (a) at the interface between the adhesive layer 12 and a semiconductor wafer 2 both being cut with the circular blade 3, so that the edge of the semiconductor wafer 2 is placed and left in the space. As a result, the rotation of the circular blade 3 causes the cut portion of the semiconductor wafer 2 to irregularly vibrate during the cutting process. It is assumed that such irregular vibration of the body interferes with the normal cutting process so that chipping can occur.

For example, Japanese Patent Laid-Open No. H05-335411 (1993) discloses a technique (Dicing Before Grinding Process) for solving such a problem. The proposed process includes the steps of performing dicing to form grooves with a certain depth in a semiconductor wafer in which devices have been formed and then back-grinding the wafer (grinding the back surface of the wafer) to the bottom of the grooves formed by dicing, so that thin semiconductor device pieces are produced. Such a process can suppress chipping. In a transferring step before the back-grinding step, however, the semiconductor wafer can easily break at the cut portions, which have been formed with a depth of several tens to hundreds μm in the semiconductor wafer by dicing. Therefore, such a process can reduce the production yield with respect to the semiconductor wafer.

It is an object of this invention to solve the above problems with the prior art and to provide a dicing adhesive sheet, wherein the production yield of a deiced body such as a semiconductor wafer is high, and chipping during the dicing is prevented.

It is another object of this invention to provide a dicing method using such a dicing adhesive sheet.

DISCLOSURE OF INVENTION

The inventors have made active investigations to solve the above problems and found that the dicing method and the dicing adhesive sheet as described below are effective at achieving the above objects. Based on the finding, this invention has been completed.

Thus, this invention related to a dicing adhesive sheet, comprising a base film and a adhesive layer formed on the base film, wherein the adhesive layer has a thickness of 1 μm to 10 μm, and the dicing adhesive sheet has a sticking temperature that win produce an adhesion of 10 N/25 mm or more when the dicing adhesive sheet is stuck on a silicon mirror wafer and then peeled off (at a peeling rate of 300 mm/minute) at 180° at 23° C.

The dicing adhesive sheet according to this invention has a thin adhesive layer and exhibits a high peeling adhesion to the deiced body in the dicing process. Though the adhesive layer is vulnerable to deformation, such features can suppress or prevent deformation of the adhesive layer and suppress or prevent peeling at the interface between the chip and the adhesive layer, so that chipping is suppressed or prevented.

If the adhesive layer is too thin, the adhesion can tend to be insufficient. Therefore, the adhesive layer needs to have a thickness of 1 μm or more. From this viewpoint, the adhesive layer preferably has a thickness of 3 μm or more. On the other hand, if the adhesive layer is too thick, the rotation of the circular blade provide an increased amount of deformation of the whole adhesive layer, so that peeling can be facilitated at the interface between the semiconductor wafer and the adhesive layer both being cut with the blade. Therefore, the adhesive layer has a thickness of 10 μm or less. In this viewpoint, the adhesive layer preferably has a thickness of 7 μm or less. In particular, the adhesive layer preferably has a thickness of 3 to 7 μm.

The dicing adhesive sheet also exhibits a peeling adhesion such that the adhesion measured when 180° peeling (the peeling rate is 300 mm/min) at 23° C. of the dicing sheet is conducted after it is stuck to a silicon mirror wafer is 10 N/25 mm or more. The adhesion is defined with respect to a silicon mirror wafer, because the silicon mirror wafer has a stable surface condition (roughness) and therefore is suitable as a general adherend and because such a silicon material can be the same as the material of a deiced body to be subjected to dicing. The adhesion is determined at 23° C. because dicing is generally performed at room temperature (23° C.). The adhesion of the dicing adhesive sheet to the silicon mirror wafer is 10 N/25 mm or more, preferably 12 N/25 mm or more. At a lower level of the adhesion, peeling can easily occur at the interface between the semiconductor wafer and the adhesive layer when the adhesive layer is deformed by the rotation of the circular blade during dicing.

Preferably, a sticking temperature at which the dicing adhesive sheet is stuck on the silicon mirror wafer is in the range from 20° C. to 80° C.

A sticking temperature of the dicing adhesive sheet stuck to the silicon mirror wafer is not particularly limited when the adhesive sheet exhibits the above adhesion after sticking. Since the dicing adhesive sheet is generally stuck to the diced body at a temperature in the range from 20 to 80° C., it is preferred that the inventive sheet exhibits the above adhesion after stuck to the silicon mirror wafer at a temperature in such a range. The adhesion to the silicon mirror wafer can be increased by appropriately controlling the sticking temperature. For example, even if the above adhesion cannot be achieved at room temperature, it can be achieved at an increased temperature.

In the dicing adhesive sheet, the adhesive layer is preferably made of a radiation-curable adhesive.

The dicing adhesive sheet, which is designed to exhibit high peeling adhesion, can interfere with the following picking up process. Therefore, it is preferred that the adhesive layer is made of the radiation-curable adhesive, which can reduce adhesion after cured by application of radiation. For example, the radiation-curable adhesive is cured to have a reduced adhesion after dicing, so that the chips can be separated (picked up) under less stress. In particular, such a radiation-curable adhesive is preferably used when a thin semiconductor wafer is employed as the diced body.

This invention also relates to a dicing method, comprising the steps of: sticking the above dicing adhesive sheet on an body to be cut at a temperature that will produce an adhesion of 10 N/25 mm or more when the sheet is stuck on a silicon mirror wafer and then peeled off (at a peeling rate of 300 mm/minute) at 180° at 23° C.; and then dicing the body.

The dicing adhesive sheet is stuck to the diced body at a temperature that will produce at least the above adhesion. The diced body is subjected to dicing while being fixed with the high peeling adhesion, so that chipping can effectively be suppressed or prevented by the dicing adhesive sheet.

BEST MODE FOR CARRYING OUT THE INVENTION

Figure 1:
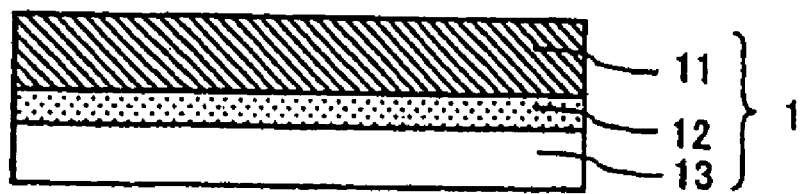
FIG. 1 is a cross-sectional diagram showing an example of the inventive dicing adhesive sheet. A dicing adhesive sheet 1 includes a base film 11 and an adhesive layer 12, which is accompanied by a separator 13.
Figure 2:
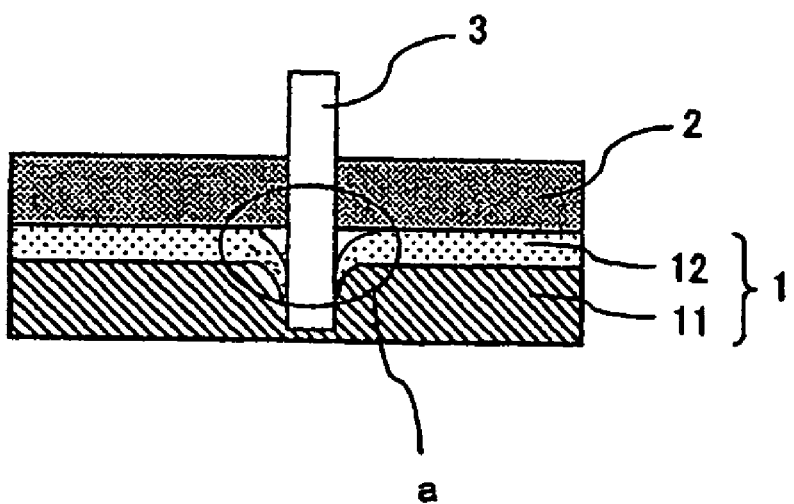
FIG. 2 is a diagram for showing the mechanism of chipping in the process of cutting a semiconductor wafer 2 with a circular blade (dicing blade) 3, wherein a dicing adhesive sheet 1 is used to fix the wafer 2.

Referring to FIG. 1, the inventive dicing adhesive sheet 1 is described in detail. As shown in FIG. 1, the inventive dicing adhesive sheet includes the base film 11 and the adhesive layer 12 formed on the base film 11. Optionally, the separator 13 is provided on the adhesive layer 12. In FIG. 1, the adhesive layer is provided on one side of the base film, but the adhesive layer may be formed on both sides of the base film. The dicing adhesive sheet may be rolled in the form of a tape.

The base film 11 may be made of any material without limitation. In particular, a plastic film is preferably used as the base film 11. Typical examples of such a plastic include polyolefines such as low density polyethylene, linear polyethylene, medium density polyethylene, high density polyethylene, ultra low density polyethylene, random copolymer polypropylene, block copolymer polypropylene, homopolypropylene, polybutene, and poly(methyl pentene); ethylene-vinyl acetate copolymer, ionomer resin, ethylene-(meth)acrylic acid copolymer, ethylene-(meth)acrylate ester (random or alternating) copolymer, ethylene-butyne copolymer, ethylene-hexene copolymer, polyurethane, polyesters such as polyethylene terephthalate, polyimide, polyetherketone, polystyrene, poly(vinyl chloride), poly(vinylidene chloride), fluororesin, silicone resin, cellulose resin, and other polymers such as crosslinked products thereof. If desired, a functional group, a functional monomer, a modifier monomer, or the like may be grafted in any of the above specified materials for the base film.

Any known film making process may be used to form the base film. Preferred examples of such a film making process include calendaring process, casting process, inflation extrusion process, and T-die extrusion process.

The base film produced by such process generally has a thickness of 10 to 300 μm, preferably about 30 to 200 μm. The base film may be any of a monolayer film and a multilayer film or may be a blend base material produced by dry-blending two or more resins. The multilayer film may be produced using the above resin or the like by any conventional film lamination process such as coextrusion process and dry lamination process. The base film may be non-oriented film or uniaxially or biaxially oriented film as needed. If desired, the surface of the base film produced by such a process may be subjected to any conventional physical or chemical treatment such as mat treatment, corona discharge treatment, primer treatment, and crosslinking treatment.

The adhesive layer 12 has a thickness of 1 to 10 μm and exhibits a 180° peeling adhesion of 10 N/25 mm or more (the peeling rate is 300 mm/min) to a silicon mirror wafer after it is stuck to the silicon mirror wafer at a controlled sticking temperature, as stated above. As long as the layer 12 has the above features, it may have any other features without limitation. Any known or conventional adhesive may appropriately be selected and used to form such an adhesive layer. A variety of adhesives may be used without limitation, for example, including rubber-based adhesive, acrylic adhesive, silicone adhesive, and polyvinyl ether adhesive. In particular, acrylic polymer-based acrylic adhesive is preferred in terms of adhesion to semiconductor wafers.

For example, the acrylic polymer may be a polymer of alkyl(meth)acrylate ester or a copolymer of alkyl(meth)acrylate ester and a copolymerizable monomer that is used as needed for the purpose of improving cohesive strength, heat resistance or the like. The term "(meth)acrylate ester" means acrylate ester and/or methacrylate ester, and "(meth)" of this invention has the same meaning herein. Examples of the alkyl ester for the alkyl(meth)acrylate ester include methyl ester, ethyl ester, butyl ester, 2-ethylhexyl ester, octyl ester, and isononyl ester. In particular, a monomer that can form a homopolymer having a glass transition temperature (hereinafter referred to as Tg) of 25° C. or higher is preferred as the main monomer from the point of peeling adhesion. The content of such a main monomer is preferably 50% by weight or more.

Examples of the copolymerizable monomer include hydroxyalkyl esters (such as hydroxyethyl ester, hydroxybutyl ester and hydroxyhexyl ester) of (meth)acrylic acid, glycidyl (meth)acrylate ester, (meth)acrylic acid, itaconic acid, maleic anhydride, (meth)acrylamide, N-hydroxymethyl (meth)acrylamide, alkylaminoalkyl esters of (meth)acrylic acid (such as dimethylaminoethyl methacrylate and tert-butylaminoethyl methacrylate), vinyl acetate, styrene and acrylonitrile. These copolymerizable monomers may be used alone, or in combination of two or more. If desired, the acrylic polymer may include a multifunctional monomer as the copolymerizable monomer component to form a crosslinked acrylic polymer.

The acrylic polymer may be produced by polymerization of a single monomer or a mixture of two or more monomers. The polymerization may be performed using any technique such as solution polymerization, emulsion polymerization, bulk polymerization, and suspension polymerization. In terms of prevention of contamination of the semiconductor wafer and the like, the content of low molecular weight substances in the adhesive layer is preferably as low as possible. From this view point, the acrylic polymer has a number average molecular weight of preferably 300,000 or more, more preferably from about 600,000 to about 3,000,000.

If desired, any crosslinking agent may be added to the adhesive to increase the number average molecular weight of the base polymer such as the acrylic polymer. Examples of the crosslinking agent include polyisocyanate compounds, epoxy compounds, aziridine compounds, melamine resins, urea resins, anhydride compounds, polyamines, and carboxyl group-containing polymers. The crosslinking agent should be used in such an amount that the peeling adhesion does not decrease too much. In a preferred mode, therefore, the crosslinking agent is generally added in an amount of about 0.01 to about 5 parts by weight based on 100 parts by weight of the base polymer. Together with the above components, the adhesive for forming the adhesive layer may contain any conventional additive such as any known tackifier, age resister, filler, antioxidant, or colorant, as needed.

In terms of improved releasability from chips, the adhesive is preferably a radiation-curable adhesive that can be cured with ultraviolet light, electron beam or the like. When the radiation-curable adhesive is used as the adhesive, the adhesive layer is irradiated with radiation after the dicing process. In such a case, therefore, it is preferred that the base film has sufficient permeability to radiation.

Any radiation-curable adhesive that has a radiation-curable functional group such as a carbon-carbon double bond and shows adherence may be used without limitation. For example, the radiation-curable adhesive may comprise the above acrylic polymer and a radiation-curable monomer or oligomer component.

Examples of the radiation-curable monomer or oligomer component to be added include esters of (meth)acrylic acid and a polyhydric alcohol, such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate and dipentaerythritol hexa(meth)acrylate; ester acrylate oligomers; and isocyanurates or isocyanurate compounds, such as 2-propenyl-di-3-butenyl cyanurate and tris(2-methacryloxyethyl)isocyanurate. In terms of high peeling adhesion to the silicon mirror wafer, the viscosity of the monomer or oligomer component is preferably, but not limited to, 5 Pa·sec or more, particularly preferably 10 Pa·sec or more, at 25° C. (when measured with a B type rotational viscometer).

In view of high peeling adhesion to the silicon mirror wafer, the amount of the radiation-curable monomer or oligomer component is for example, but not limited to, 30 to 150 parts by weight, preferably 50 to 120 parts by weight, based on 100 parts by weight of the base polymer for forming the adhesive, such as the acrylic polymer.

The radiation-curable adhesive may include a base polymer that has a carbon-carbon double bond on its side chain of a polymer, in its main chain or at the terminal of its main chain. Such a base polymer preferably has a basic skeleton of an acrylic polymer. In such a case, the radiation-curable monomer or oligomer component may not particularly be added and may be used as needed.

The radiation-curable adhesive should contain a photopolymerization initiator, in the case that ultraviolet light or the like is used to cure it. Examples of the photopolymerization initiator include benzoin alkyl ethers such as benzoin methyl ether, benzoin propyl ether, benzoin isopropyl ether, and benzoin isobutyl ether; aromatic ketones such as benzil, benzoin, benzophenone, and a-hydroxycyclohexyl phenyl ketone; aromatic ketals such as benzyl dimethyl ketal; polyvinylbenzophenone; and thioxanthone compounds such as chlorothioxanthone, dodecylthioxanthone, dimethylthioxanthone, and diethylthioxanthone. The amount of the photopolymerization initiator is, for example, from about 0.1 to 10 parts by weight, preferably from 0.5 to 5 parts by weight, based on 100 parts by weight of the base polymer for forming the adhesive, such as the acrylic polymer.

The inventive dicing adhesive sheet may be produced by a process including the steps of applying a solution of the adhesive to the surface of the base film 11 and drying the applied material (and optionally crosslinking the material by heat) to form the adhesive layer 12, and optionally attaching the separator 13 on the surface of the adhesive layer 12. Any alternative process may also be used, for example, including the steps of forming the adhesive layer 12 on a release liner 13 in an independent manner and then attaching them to the base film 11.

The separator 13 is optionally provided to form a label or to smooth the adhesive. Examples of the material for forming the separator include paper and a film of a synthetic resin such as polyethylene, polypropylene, and polyethylene terephthalate. If desired, the surface of the separator may be subjected to repellent treatment such as silicone treatment, long-chain alkyl treatment and fluorine treatment in order to have high releasability from the adhesive layer. If necessary, an ultraviolet light transmission-blocking treatment may be performed to prevent the adhesive sheet from reacting with the environmental ultraviolet light. The separator has a thickness of generally 10 to 200 μm, preferably about 25 to 100 μm.

According to this invention, the dicing adhesive sheet is stuck to a diced body, such as a semiconductor component, at a temperature that allows the sheet to exhibit an adhesion of 10 N/25 mm or more. After sticking, the dicing adhesive sheet is subjected to dicing, according to a conventional process. The dicing may be performed at a temperature of about 10° C. to 35° C., generally at room temperature (23° C.). In the dicing process, the diced body is cut into a certain size with a blade rotating at high speed. The dicing may be performed by the so-called full-cut process, which includes the step of cutting into the base material of the adhesive sheet. When the radiation-curable adhesive is used for the adhesive layer, the dicing is followed by the step of irradiating the adhesive layer with radiation depending on the type of the adhesive, so that the adhesive layer is cured to have reduced adhesion. The adhesive layer is cured with such radiation after the dicing, so that its adhesion is reduced and peeling can be facilitated. Any radiation may be used without limitation, for example, including ultraviolet radiation.

EXAMPLES

This invention is described in more detail by showing the examples below. However, such examples are not intended to limit the scope of this invention.

Example 1

Base Film

The base film used was a linear low density polyethylene film with a thickness of 70 μm. One side of the film was corona treated.

Preparation of Adhesive

A solution of a radiation-curable acrylic adhesive was produced by adding 60 parts by weight of a radiation-curable oligomer (with a viscosity of 10 Pa·sec at 25° C.), 3 parts by weight of a photopolymerization initiator (Irgacure 651 (trade name) manufactured by Chiba Specialty Chemicals) and 2 parts by weight of a polyisocyanate compound (Coronate L (trade name) manufacture by Nippon Polyurethane Industry Co., Ltd.) to a solution containing an acrylic copolymer with a weight average molecular weight of 800,000. The radiation-curable oligomer was a product of the reaction of pentaerythritol triacrylate and diisocyanate. The acrylic copolymer was a product of conventional polymerization of 60 parts by weight of methyl acrylate (which can form a homopolymer with a Tg of 8° C.), 30 parts by weight of butyl acrylate (which can form a homopolymer with a Tg of −54° C.) and 10 parts by weight of acrylic acid (which can be form a homopolymer with a Tg of 106° C.) in ethyl acetate.

Preparation of Dicing Adhesive

The resulting adhesive solution was applied to the corona-treated surface of the base film and crosslinked at 80° C. for 10 minutes to form a radiation-curable adhesive layer with a thickness of 7 μm. A separator was attached to the surface of the adhesive layer, so that an ultraviolet light-curable dicing sheet was prepared.

Example 2

Preparation of Adhesive

A solution of a radiation-curable acrylic adhesive was produced by adding 50 parts by weight of pentaacrylate ester (Kayarad SR-9041 (trade name) manufactured by Nippon Kayaku Co., Ltd., with a viscosity of 15 Pa·sec at 25° C.), 3 parts by weight of a photopolymerization initiator (Irgacure 651 (trade name) manufactured by Chiba Specialty Chemicals) and 3 parts by weight of a polyisocyanate compound (Coronate L (trade name) manufacture by Nippon Polyurethane Industry Co., Ltd.) to a solution containing an acrylic copolymer with a weight average molecular weight of 700,000. The acrylic copolymer was a product of conventional polymerization of 50 parts by weight of ethyl acrylate (which can form a homopolymer with a Tg of −22° C.), 25 parts by weight of 2-ethylhexyl acrylate (which can form a homopolymer with a Tg of −85° C.), 20 parts by weight of acryloylmorpholine, and 5 parts by weight of acrylic acid (which can be form a homopolymer with a Tg of 106° C.) in ethyl acetate.

Preparation of Dicing Adhesive

The process of Example 1 was used to form an ultraviolet light-curable dicing sheet except that the above resulting adhesive solution was used and that the adhesive layer was formed with a thickness of 5 μm.

Comparative Example 1

Preparation of Adhesive

A solution of a radiation-curable acrylic adhesive was produced by adding 60 parts by weight of pentaerythritol triacrylate (with a viscosity of 1 Pa·sec at 25° C.), 3 parts by weight of a photopolymerization initiator (Irgacure 651 (trade name) manufactured by Chiba Specialty Chemicals) and 5 parts by weight of a polyisocyanate compound (Coronate L (trade name) manufacture by Nippon Polyurethane Industry Co., Ltd.) to a solution containing an acrylic copolymer with a weight average molecular weight of 700,000. The acrylic copolymer was a product of conventional polymerization of 95 parts by weight of 2-ethylhexyl acrylate (which can form a homopolymer with a Tg of −85° C.) and 5 parts by weight of acrylic acid (which can be form a homopolymer with a Tg of 106° C.) in ethyl acetate.

Preparation of Dicing Adhesive

The process of Example 1 was used to from an ultraviolet light-curable dicing sheet except that the above resulting adhesive solution was used.

Comparative Example 2

The process of Example 1 was used to form an ultraviolet light-curable dicing sheet except that the radiation-curable adhesive layer was formed with a thickness of 20 μm.

Peeling Adhesion to Silicon Mirror Wafer

Each of the dicing adhesive sheets obtained in Examples and Comparative Examples was cut into strips each with a width of 25 mm, which were each stuck on the surface of a silicon mirror wafer (CZN<100>2.5–3.5 (4 inch) manufactured by Shin-Etsu Handotai Co., Ltd.) on a hot plate set at 23° C. (room temperature) or 70° C. The sheet was then allowed to stand under the room temperature atmosphere for 30 minutes and then peeled off (at a peeling rate of 300 mm/minute) at an angle of 180° in a 23° C. thermostatic chamber when the adhesion was measured. The results are shown in Table 1.

Evaluation of Chipping

Under a 23° C. (room temperature) or 70° C. atmosphere, a 6 inch wafer with a thickness of 150 pm, whose back surface was polished (#2000 finish), was mounted on each of the dicing adhesive sheets obtained in Examples and Comparative Examples. The wafer was then diced at 23° C. (room temperature) under the conditions below. After the dicing, ultraviolet light was irradiated from the side of the back surface of the sheet (at 500 mJ/cm$^2$). Thereafter, 50 semiconductor chips were picked up (separated) at random. An optical microscope (200×) was used to observe the depth of chipping in the chip thickness direction at the side face of the semiconductor chip. The number of chipping was counted for each size. The results are shown in Table 1.

Yield

The yield (%) was obtained as a percentage of the chips with a chipping size of less than 50 μm with respect to the 50 semiconductor chips randomly obtained for chipping evaluation.

Dicing Conditions
  Dicer: DFD-651 manufactured by Disco Corporation
  Blade: 27HECC manufactured by Disco Corporation
  Number of rotations of blade: 40000 rpm
  Dicing speed: 120 mm/sec
  Dicing depth: 25 μm
  Cut mode: down cut
  Dicing size: 2.5 mm×2.5 mm

TABLE 1

| | | Thickness of Adhesive Layer (μm) | Peeling Adhesion to Silicon Mirror Wafer (N/25 mm) | Chipping Count (number) Chipping Size | | | | | Yield (%) |
|---|---|---|---|---|---|---|---|---|---|
| | | | | 25 μm - | 50 μm - | 75 μm - | 100 μm - | Total | |
| Stuck at 23° C. | Example 1 | 7 | 11 | 5 | 0 | 0 | 0 | 5 | 100 |
| | Example 2 | 5 | 8 | 6 | 3 | 1 | 0 | 7 | 92 |
| | Comparative Example 1 | 7 | 3 | 27 | 6 | 1 | 0 | 34 | 86 |
| | Comparative Example 2 | 20 | 13 | 17 | 2 | 1 | 0 | 20 | 94 |
| Stuck at 70° C. | Example 1 | 7 | 15 | 2 | 0 | 0 | 0 | 2 | 100 |
| | Example 2 | 5 | 12 | 4 | 0 | 0 | 0 | 4 | 100 |
| | Comparative Example 1 | 7 | 6 | 20 | 4 | 1 | 0 | 25 | 90 |
| | Comparative Example 2 | 20 | 17 | 11 | 1 | 1 | 0 | 13 | 96 |

Table 1 shows: Even with a thin adhesive layer, the dicing adhesive sheet of Example 1 has a peeling adhesion of 10 N/25 mm or more to the silicon mirror wafer after stuck at either room temperature (23° C.) or a high temperature (70° C.) and therefore causes no chipping in a size of 50 μm or more and provides a good yield; After stuck at room temperature (23° C.), the sheet of Example 2 has a peeling adhesion of less than 10 N/25 mm to the silicon mirror wafer and causes chipping in a size of 50 μm or more at a low level, but after stuck at a high temperature (70° C.), it has a peeling adhesion of 10 N/25 mm or more to the silicon mirror wafer, causes no chipping in a size of 50 μm or more and provides a good yield; In contrast, after stuck at either room temperature (23° C.) or a high temperature (70° C.), the sheet of Comparative Example 1 has a peeling adhesion of less than 10 N/25 mm to the silicon mirror wafer, causes chipping in a size of 50 μm or more and provides a poor yield; After stuck at either room temperature (23° C.) or a high temperature (70° C.), the sheet of Comparative Example 2 has a peeling adhesion of 10 N/25 mm or more to the silicon mirror wafer but causes chipping in a size of 50 μm or more and provides a poor yield, because the adhesive layer has a thickness of more than 10 μm.

INDUSTRIAL APPLICABILITY

According to this invention, the dicing method using the dicing adhesive sheet can produce cut products in good yield and can prevent chipping in the dicing process. In particular, the sheet according to this invention is useful as a semiconductor wafer dicing sheet or the like for fixing the body to be cut, such as a semiconductor wafer. Therefore, this invention has a high industrial applicability.

The invention claimed is:

1. A dicing adhesive sheet, comprising a base film and an adhesive layer formed on the base film, wherein the adhesive layer has a thickness of 1 μm to 10 μm, the adhesive layer is made of a radiation-curable adhesive and the dicing adhesive sheet has a sticking temperature at which the dicing adhesive an adhesion of 10 N/25 mm or more as measured when the dicing adhesive sheet is stuck on a silicon mirror wafer and then peeled off at a peeling rate of 300 mm/minute at 180° at 23° C.

2. The dicing adhesive sheet according to claim 1, wherein the sticking temperature at which the dicing adhesive sheet is stuck on the silicon mirror wafer is in the range from 20° C. to 80° C.

3. A dicing adhesive sheet, comprising a base film and an adhesive layer formed on the base film, wherein the adhesive layer has a thickness of 1 μm to 10 μm, the adhesive layer is made of a radiation-curable adhesive, and the dicing adhesive sheet has an adhesion of 10 N/25 mm or more as measured when the dicing adhesive sheet is stuck on a silicon mirror wafer at a predetermined sticking temperature and then peeled off at a peeling rate of 300 mm/minute, at an angle of 180° and at a temperature of 23° C.

4. The dicing adhesive sheet according to claim 3, wherein the sticking temperature is from 20° C. to 80° C.

* * * * *

UNITED STATES PATENT AND TRADEMARK OFFICE
CERTIFICATE OF CORRECTION

PATENT NO. : 7,183,007 B2 Page 1 of 1
APPLICATION NO. : 10/486165
DATED : February 27, 2007
INVENTOR(S) : Syouji Yamamoto It is certified that error appears in the above-identified patent and that said Letters Patent is hereby corrected as shown below:

On First Page, at Column 1, Line 1, in Inventor section, after "Ibaraki" please insert -- -shi, Osaka --.

Signed and Sealed this

Tenth Day of June, 2008

JON W. DUDAS
*Director of the United States Patent and Trademark Office*